(12) United States Patent
Choi et al.

(10) Patent No.: US 11,637,157 B2
(45) Date of Patent: Apr. 25, 2023

(54) ORGANIC LIGHT EMITTING DISPLAY APPARATUS INCLUDING A MIRROR PATTERN

(71) Applicant: Samsung Display Co., Ltd, Yongin-si (KR)

(72) Inventors: Jun-Ho Choi, Yongin-si (KR);
Joon-Youp Kim, Seoul (KR);
Young-Woo Song, Suwon-si (KR);
Jin-Koo Chung, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 15/411,664

(22) Filed: Jan. 20, 2017

(65) Prior Publication Data
US 2017/0338292 A1    Nov. 23, 2017

(30) Foreign Application Priority Data
May 17, 2016  (KR) .......................... 10-2016-0060454

(51) Int. Cl.
| H01L 27/32 | (2006.01) |
| H01L 51/50 | (2006.01) |
| H01L 51/52 | (2006.01) |

(52) U.S. Cl.
CPC ...... *H01L 27/3246* (2013.01); *H01L 27/3216* (2013.01); *H01L 27/3218* (2013.01); *H01L 51/504* (2013.01); *H01L 51/5253* (2013.01); *H01L 51/5271* (2013.01); *H01L 51/5284* (2013.01); *H01L 51/524* (2013.01)

(58) Field of Classification Search
CPC ............. H01L 27/3246; H01L 27/3211; H01L 51/5271; H01L 51/5284; H01L 27/3216; H01L 27/3218; H01L 27/3213; H01L 27/3248; H01L 27/3272
USPC ......................................... 257/40, 89, 51.022
See application file for complete search history.

(56) References Cited

U.S. PATENT DOCUMENTS

| 9,070,900 | B2* | 6/2015 | Tanaka | H01L 51/5259 |
| 9,099,676 | B2 | 8/2015 | Kuo et al. | |
| 9,484,557 | B2* | 11/2016 | Choi | H01L 51/5237 |
| 9,692,012 | B2* | 6/2017 | Lee | H01L 27/3244 |
| 9,997,583 | B2* | 6/2018 | Zhang | H01L 25/048 |
| 2003/0214691 | A1* | 11/2003 | Magno | H01L 27/3281 |
| | | | | 313/498 |
| 2003/0230972 | A1* | 12/2003 | Cok | H01L 27/322 |
| | | | | 313/504 |

(Continued)

FOREIGN PATENT DOCUMENTS

| CN | 102437172 A | 5/2012 |
| CN | 103855191 A | 6/2014 |

(Continued)

*Primary Examiner* — Khiem D Nguyen
(74) *Attorney, Agent, or Firm* — Innovation Counsel LLP

(57) ABSTRACT

An organic light emitting display apparatus includes a plurality of pixels, each of the pixels including first mirror pattern having an opening, and first to third sub pixels. The first sub pixels includes a first light emitting structure and is positioned to emit first color light through the opening, the second sub pixel includes a second light emitting structure positioned to emit second color light through the opening, and the third sub pixel includes a third light emitting structure positioned to emit third color light through the opening.

18 Claims, 9 Drawing Sheets

(56) References Cited

U.S. PATENT DOCUMENTS

| | | | |
|---|---|---|---|
| 2005/0062912 A1 | 3/2005 | Otake | |
| 2009/0236976 A1* | 9/2009 | Lee | H01L 51/5284 |
| | | | 257/E33.044 |
| 2011/0031511 A1* | 2/2011 | Heo | H01L 51/5048 |
| | | | 257/88 |
| 2012/0299472 A1 | 11/2012 | Chung et al. | |
| 2013/0049640 A1 | 2/2013 | Kuo et al. | |
| 2014/0211103 A1* | 7/2014 | Baek | G06F 3/0421 |
| | | | 349/110 |
| 2014/0353625 A1* | 12/2014 | Yi | H01L 51/5253 |
| | | | 257/40 |
| 2015/0041777 A1* | 2/2015 | Chung | H01L 51/5271 |
| | | | 257/40 |
| 2015/0076458 A1* | 3/2015 | Lee | H01L 51/56 |
| | | | 257/40 |
| 2015/0102317 A1* | 4/2015 | Kim | H01L 51/107 |
| | | | 438/22 |
| 2016/0043154 A1 | 2/2016 | Choi et al. | |
| 2016/0064692 A1* | 3/2016 | Moon | H01L 27/326 |
| | | | 257/40 |
| 2016/0293670 A1* | 10/2016 | Chen | H01L 51/5088 |
| 2017/0097545 A1 | 4/2017 | Yim et al. | |

FOREIGN PATENT DOCUMENTS

| | | |
|---|---|---|
| JP | 2005-070428 A | 3/2005 |
| KR | 10-2011-0077838 A | 7/2011 |
| KR | 10-2015-0050318 A | 5/2015 |
| KR | 10-2016-0017388 A | 2/2016 |

* cited by examiner

FIG. 1
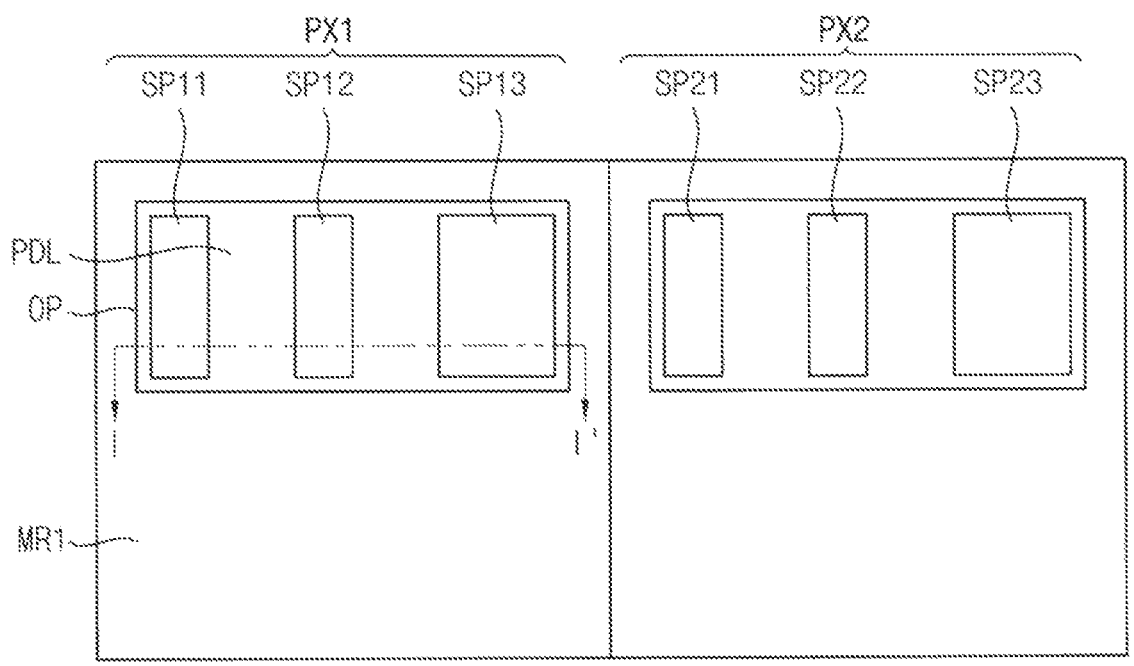

ORGANIC LIGHT EMITTING DISPLAY APPARATUS INCLUDING A MIRROR PATTERN

This application claims priority to and the benefit of Korean Patent Application No. 10-2016-0060454 filed on May 17, 2016, the disclosure of which is incorporated by reference herein in its entirety.

BACKGROUND

1. Field

Exemplary embodiments of the inventive concept relate to an organic light emitting display apparatus. More particularly, exemplary embodiments of the inventive concept relate to an organic light emitting display apparatus having mirror function and display function.

2. Description of the Related Art

A display device displays an image using a pixel emitting light. An organic light emitting display device includes the pixel having an organic light emitting diode (OLED). The OLED emits light with a wavelength that varies according to the organic material included in the OLED. For example, the OLED includes the organic material corresponding to one of a red color light, a green color light, and a blue color light. The organic light emitting display device displays the image by mixing the light emitted by the organic materials.

Recently, need for a display apparatus having a mirror function and a display function has been growing, due to the increasing range of use of the display apparatus. However, the display apparatus having mirror function and display function tends to have a lower display quality than normal display apparatus without the mirror function.

SUMMARY

One or more exemplary embodiment of the inventive concept provides an organic light emitting display apparatus capable of improving display quality and mirror quality, and capable of improving aperture ratio.

According to an exemplary embodiment of the inventive concept, an organic light emitting display apparatus includes a plurality of pixels. Each of the pixels includes a first mirror pattern having an opening, a first sub pixel including a first light emitting structure positioned to emit a first color light through the opening, a second sub pixel including a second light emitting structure positioned to emit a second color light through the opening, and a third sub pixel including a third light emitting structure positioned to emit a third color light through the opening.

In an exemplary embodiment, the first light emitting structure may have a first organic light emitting layer, the second light emitting structure may have a second organic light emitting layer, and the third light emitting structure may have a third organic light emitting layer, and the opening may extend continuously over the first, second, and third organic light emitting layers in plan view.

In an exemplary embodiment, the organic light emitting display apparatus may further include a pixel defining layer positioned between the first and second organic light emitting layers, wherein the pixel defining layer is opaque.

In an exemplary embodiment, the pixel defining layer may include carbon black and organic insulation material.

In an exemplary embodiment, the first sub pixel, the second sub pixel and the third sub pixel may be arranged in a first direction.

In an exemplary embodiment, the first sub pixel and the second sub pixel may be disposed adjacent to each other in a second direction which crosses a first direction. The third sub pixel may be disposed adjacent to the first and second sub pixels in the first direction.

In an exemplary embodiment, the plurality of pixels may include first pixel and second pixel. The first pixel may include a set of first-pixel sub pixels, such as a first sub pixel (SP11), a second sub pixel (SP12), and a third sub pixel (SP13). The second pixel may include a set of second-pixel sub pixels, such as a first sub pixel (SP21), a second sub pixel (SP22), and a third sub pixel (SP23). The opening may continuously extend from the first pixel to the second pixel, so that the first-pixel sub pixels and the second-pixel sub pixels are disposed in the opening.

In an exemplary embodiment, the first-pixel sub pixels and the second-pixel sub pixels may be symmetrically arranged with respect to a boundary between the first pixel and the second pixel.

In an exemplary embodiment, the organic light emitting display apparatus may further include a third pixel that has third-pixel sub pixels and a fourth pixel that has a set of fourth-pixel sub pixels, wherein each of the first, second, third, and fourth pixels shares a border with two other pixels of the first, second, third, and fourth pixels The opening may extend continuously across the borders between the first pixel, the second pixel, the third pixel, and the fourth pixel so that the first-pixel sub pixels, the second-pixel sub pixels, and the third-pixel sub pixels, and the fourth-pixel sub pixels are disposed in the opening.

In an exemplary embodiment, the organic light emitting display apparatus may further include a sealing substrate. The first mirror pattern may be disposed on the sealing substrate.

In an exemplary embodiment, the organic light emitting display apparatus may further include a pixel defining layer between the first and second light emitting structures, and between the second and third light emitting structures, and a black matrix which is disposed on the sealing substrate in the opening and overlaps the pixel defining layer.

In an exemplary embodiment, the first sub pixel may include a first sub pixel electrode, and the first light emitting structure may be disposed on the first sub pixel electrode. The second sub pixel may include, and the second light emitting structure may be disposed on the second sub pixel electrode. The third sub pixel may include a third sub pixel electrode, and the third light emitting structure may be disposed on the third sub pixel electrode. The first, second, and third sub pixel electrodes may be connected to first, second, and third thin film transistors, respectively, and may not overlap the first, second, and third thin film transistors.

In an exemplary embodiment, the organic light emitting display apparatus may further include a thin film encapsulation layer which is disposed on the first light emitting structure, the second light emitting structure, and the third light emitting structure and includes at least one inorganic film and at least one organic film, the at least one of the inorganic film and the at least one of the organic film being alternately stacked.

In an exemplary embodiment, the first mirror pattern may be disposed on the thin film encapsulation layer.

In an exemplary embodiment, the first mirror pattern may be disposed between the inorganic film and the organic film of the thin film encapsulation layer.

In an exemplary embodiment, the organic light emitting display apparatus may further include a second mirror layer which is disposed on the first mirror pattern and disposed in the opening of the first mirror pattern.

In an exemplary embodiment, the first to third light emitting structure may share a common layer that continuously extends between a first sub pixel electrode, a second sub pixel electrode, and a third sub pixel electrode of the first, second, and third light emitting structures. The common layer may include a hole injection layer, a hole transfer layer, an electron transfer layer, and an electron injection layer.

A pixel defining layer may be formed on select parts of the common layer and separate neighboring organic light emitting layers.

In an exemplary embodiment, a first sub pixel electrode may overlap with the first organic light emitting layer, a second sub pixel electrode may overlap with the second organic light emitting layer, and a third sub pixel electrode may overlap with the third organic light emitting layer. The first to third light emitting structures may further include an opposite electrode covering the first to third sub pixels.

According to an exemplary embodiment of the inventive concept, an organic light emitting display apparatus includes a base substrate, a first sub pixel electrode disposed on the base substrate, a second sub pixel electrode disposed on the base substrate and spaced apart from the first sub pixel electrode, a pixel defining layer which is opaque and disposed between the first to third sub pixel electrodes, and a first mirror pattern overlapping the pixel defining layer and having an opening. All portions of the first to third sub pixel electrodes are disposed between the pixel defining layers are disposed in the opening.

In an exemplary embodiment, the organic light emitting display apparatus may further include a plurality of pixels which are arranged in a matrix form such that at least two pixels of the plurality of pixels are adjacent to each other to form a pair of adjacent pixels. Each of the pixels may include the first to third sub pixels. The opening of the first mirror pattern may be formed for each of two pixels which are disposed adjacent to each other. Portions of the first to third sub pixels of the two adjacent pixels may be disposed in the opening.

In an exemplary embodiment, the first sub pixel electrode maybe disposed adjacent to the second sub pixel electrode in a second direction. The third sub pixel electrode may be disposed adjacent to the first sub pixel electrode in a first direction which crosses the second direction.

In an exemplary embodiment, the organic light emitting display apparatus may further include a plurality of pixels that are arranged in a matrix form such that at least two pixels of the plurality of pixels are adjacent to each other to form a pair of adjacent pixels. Each of the pixels may include the first to third sub pixels. Arrangement of the first to third sub pixels of one pixel may be symmetric to an arrangement of first to third sub pixels of adjacent pixel 1 with respect to a boundary between the adjacent pixels.

According to an exemplary embodiment of the inventive concept, an organic light emitting display apparatus includes a plurality of pixels configured to emit light to display an image, and a mirror pattern defining openings and configured to reflect light. Each of the pixel includes plurality of sub pixels which emits color light different from each other. A plurality of sub pixels are disposed in one opening of the mirror pattern.

According to the present inventive concept, an organic light emitting display apparatus includes a pixel defining layer having black color, and a first mirror pattern having an opening. A plurality of sub pixels (for example, first to third sub pixels) are disposed in the opening, so that distance between openings disposed adjacent to each other is larger, as compared to a case when each of openings are formed corresponding to each of the sub pixels. Accordingly, diffraction due to the opening of the first mirror may be reduced. In addition, each of the opening has relatively large size, so that align margin may be secured when the base substrate and the sealing substrate are assembled.

In addition, the first mirror pattern is disposed not to overlap the first to third sub pixels which are light emitting area. Accordingly, aperture ratio is improved compared to a structure which has a minor pattern overlapping the light emitting area. Thus, display quality may be improved.

In addition, the pixel defining layer has black color, so that degradation of display quality due to reflection, diffraction and scattering of light be reduced although the pixel defining layer is formed in the opening.

In addition, the organic light emitting display apparatus may obtain desired reflectance by controlling size of the opening of the first mirror pattern although the size of the first to third sub pixels is constant.

In yet another aspect, the inventive concept pertains to an organic light emitting display apparatus that includes a first pixel having a base substrate and a plurality of first-pixel sub pixels positioned on the base substrate. The base substrate is covered by a reflective mirror pattern except for an opening. The first-pixel sub pixels transmit light through the opening.

BRIEF DESCRIPTION OF THE DRAWINGS

The above and other features of the inventive concept will become more apparent by describing in detail exemplary embodiments thereof with reference to the accompanying drawings, in which:

FIG. 1 is a plan view illustrating a pixel of an organic light emitting display apparatus according to an exemplary embodiment of the inventive concept;

DETAILED DESCRIPTION

Hereinafter, the inventive concept will be explained in detail with reference to the accompanying drawings.

Figure 2:
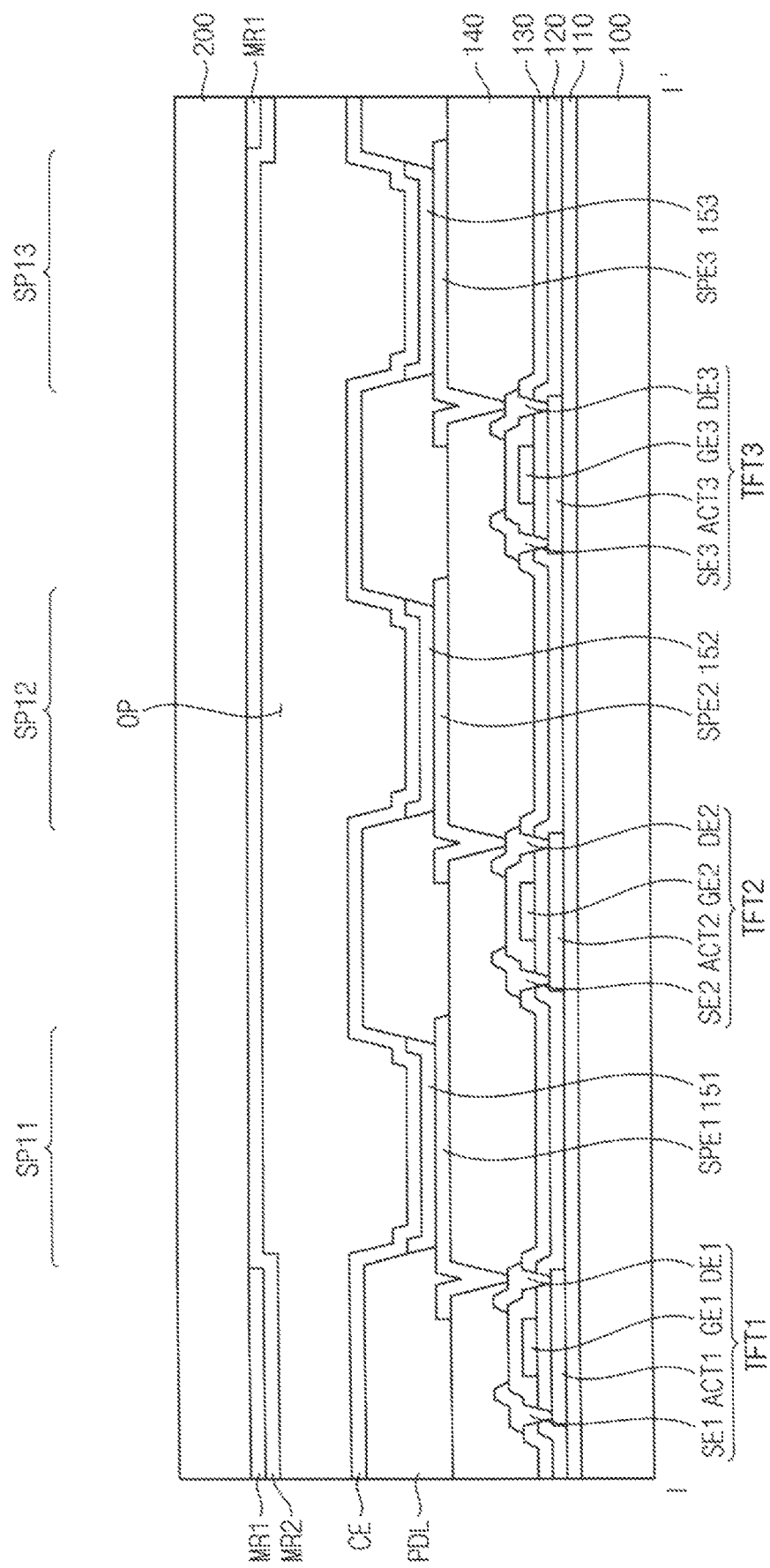
FIG. 2 is a cross-sectional view taken along a line I-I' of FIG. 1.

FIG. 1 is a plan view illustrating a pixel of an organic light emitting display apparatus according to an exemplary embodiment of the inventive concept. FIG. 2 is a cross-sectional view taken along a line I-I' of FIG. 1.

Referring to FIG. 1, the organic light emitting display apparatus includes a plurality of pixels which are arranged in a matrix form in a first direction D1 and a second direction D2 which crosses the first direction D1. A first pixel PX1 and a second pixel PX2 are described in the figures.

The organic light emitting display apparatus includes a first pixel PX1 and a second pixel PX2. The first pixel PX1 may include first-pixel sub pixels, which in this particular case include a first sub pixel SP11, a second sub pixel PX12 and a third sub pixel SP13. The second pixel PX2 may include second-pixel sub pixels, which in this particular case include a first sub pixel SP21, a second sub pixel PX22 and a third sub pixel SP23. In one embodiment, the first sub pixel of each pixel (e.g., SP11 and SP21) generate the same-colored light, the second sub pixel of each pixel (e.g., SP12 and SP22) generate the same-colored light, and the third sub pixel of each pixel (e.g., SP13 and SP23) generate the same-colored light. In one embodiment, the first sub pixel, second sub pixel, and third sub pixel may generate lights of red, green, and blue colors, respectively.

The first pixel PX1 and the second pixel PX2 may be disposed adjacent to each other.

The first sub pixel SP11 may emit a first color light. The second sub pixel SP2 may emit a second color which is a different color from the color of the first color light. The third sub pixel SP13 may emit a third color light which is a different color from the colors of the first and second color lights. For example, the first color light may be red light, the second color light may be green light, and the third color light may be blue light. In an example embodiment, configuration of the sub pixels may be different from what is described. For example, each of the sub pixels may emit all or any of red, green, blue, and/or another color light; some of the sub pixels may emit white color light. The sizes/areas of the sub pixels SP11, SP12, and SP13 may vary depending on factors such as the colors of the light.

The second pixel PX2 may have a structure substantially the same as the first pixel PX1.

A first mirror pattern MR1 is formed except in areas overlapping the first to third sub pixels SP11 through SP23 of the first and second pixels PX1 and PX2.

The first mirror pattern MR1 the first mirror pattern MR1 may reflect external light. Accordingly, the organic light emitting display apparatus may work as a mirror display having display function and mirror function.

The first mirror pattern MR1 may be disposed corresponding to all of the plurality of pixels, and define an opening OP in each of the pixels. In a plan view, the sub pixels corresponding to each of the pixels may be disposed in the opening OP. Thus, the first set of sub pixels (i.e., first to third sub pixels SP11, SP12 and SP13 of the first pixel PX1 in this example are disposed in the opening OP of the first mirror pattern MR1 corresponding to the first pixel PX1. The second set of sub pixels (i.e., first to third sub pixels SP2, SP22 and SP23 of the second pixel PX2 in this example) are disposed in an opening OP of the first mirror pattern MR1 corresponding to the second pixel PX2.

A pixel defining layer PDL is disposed around and between the first to third sub pixels SP11 to SP23. A portion of the pixel defining layer PDL may be exposed by the opening of the first mirror pattern MR1. Thus, in a plan view, the first to third sub pixels and the pixel defining layer PDL may be disposed in the opening OP of the first mirror pattern MR1.

The pixel defining layer PDL may be a black pixel defining layer (black PDL). Thus, the pixel defining layer PDL may include a black colored material which blocks light. Accordingly, although the portion of the pixel defining layer PDL exposed by the opening OP is visible to users, the pixel defining layer PDL has black color, so that degradation of display quality due to reflection, diffraction, and/or scattering of light may be prevented.

Thus, the opening of the first mirror pattern MR1 may be larger than the sub pixel openings of the pixel defining layer PDL—compared individually or in aggregate area—which exposes sub pixel electrodes (refers to SPE1, SPE2 and SPE3 of FIG. 2) of the sub pixels of the corresponding pixel. Thus, the opening OP is larger than any sub pixel opening of the pixel defining layer PDL disposed in the opening OP.

A plurality of sub pixels such as the first to third sub pixels SP11, SP12 and SP13 are disposed in the opening OP, so that the distance between openings in the first mirror pattern MR1 disposed adjacent to each other is larger, as compared to a case where each of the openings of the mirror pattern are formed corresponding to each of the sub pixels. According to the present example embodiment, compared to a case where each opening of the mirror pattern is formed for each of the sub pixels, the distance between opening OP in the first mirror pattern MR1 disposed adjacent to each other is relatively large, and each of the openings OP in the first mirror pattern MR1 is relatively large. Thus, diffraction due to the first mirror pattern MR1 may be reduced. In addition, each of the openings OP has relatively large size, so that the base substrate and the sealing substrate can be aligned within the margin of error upon assembly.

In addition, the first mirror pattern MR1 is disposed to not overlap the first to third sub pixels SP11 through SP23, which are light emitting area. Accordingly, aperture ratio is improved compared to a structure which has a mirror pattern overlapping the light emitting area. Thus, display quality may be improved.

In addition, the pixel defining layer PDL has a black color, so that degradation of display quality due to reflection, diffraction and scattering of light may be reduced although the pixel defining layer PDL is formed in the opening OP.

In addition, the organic light emitting display apparatus may obtain desired reflectance by controlling the size of the opening OP of the first mirror pattern MR1 while the size of the first to third sub pixels SP11 through SP23 remains constant.

Referring to FIG. 2, the display apparatus includes a base substrate 100, a buffer layer 110, a first insulation layer 120, a second insulation layer 130, a planarization layer 140, a first thin film transistor TFT1, a second thin film transistor TFT2, a third thin film transistor TFT3, a first sub pixel electrode SPE1, a second sub pixel electrode SPE2, a third sub pixel electrode SPE3, a pixel defining layer PDL, a first light emitting structure 151, a second light emitting structure 152, a third light emitting structure 153, an opposite electrode CE, a first mirror pattern MR1, and a sealing substrate 200. As used herein, a "sub pixel" refers to the region that includes a sub pixel electrode SPE, a light emitting structure, and common electrode that are coupled to emit light. For example, referring to FIG. 2, a first sub pixel SP11 refers to the region that includes the first sub pixel electrode SPE1, the first light emitting structure 151, and the common electrode CE. A layer of the light emitting structures that is shared by a plurality of sub pixels is herein referred to as a "common layer." Although not explicitly shown, a color filter layer may be part of each sub pixel. The display apparatus may further include a second mirror layer MR2 if necessary.

The base substrate 100 may include a transparent insulation substrate. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be disposed on the base substrate 100. The buffer layer 110 may prevent diffusion of metal atoms and/or impurities from the base substrate 100. Additionally, the buffer layer 110 may adjust heat transfer rate of a successive crystallization process for first to third active patterns ACT1, ACT2 and ACT3, to thereby obtain a substantially uniform first to third active patterns ACT1, ACT2 and ACT3. In the case where the base substrate 100 may have a relatively irregular surface, the buffer layer 110 may improve flatness of the surface of the base substrate 100. The buffer layer 110 may be formed using a silicon compound. For example, the buffer layer 110 may include silicon oxide (SiOx) silicon nitride (SiNx), silicon oxynitride (SiOxNy), silicon oxycarbide (SiOxCy), silicon carbon nitride (SiCxNy), etc. These may be used alone or in a mixture thereof.

The first active pattern ACT1 the second active pattern ACT2 and the third active pattern ACT3 may be disposed on the buffer layer 110.

Each of the first to third active patterns ACT1, ACT2 and ACT3 may include a source area and a drain area which are impurity-doped areas, and a channel area between the source area and the drain area.

The first insulation layer 120 may be disposed on the buffer layer 110 on which the first to third active patterns ACT1, ACT2 and ACT3 are disposed. The first insulation layer 130 may include a silicon compound, metal oxide, etc. For example, the first insulation layer 130 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. In example embodiments, the first insulation layer 120 may be uniformly formed on the buffer layer 110 along a profile of the first to third active patterns ACT1, ACT2 and ACT3. Here, the first insulation layer 120 may have a substantially small thickness, such that a stepped portion may be formed at a portion of the first insulation layer 120 adjacent to the first to third active patterns ACT1, ACT2 and ACT. In some example embodiments, the first insulation layer 120 may have a relatively large thickness for sufficiently covering the first to third active patterns ACT1, ACT2 and ACT, so that the first insulation layer 120 may have a substantially level surface.

A gate pattern may be disposed on the first insulation layer 120. The gate pattern may include metal, alloy, conductive metal oxide, a transparent conductive material, etc.

The gate pattern may include first to third gate electrodes GE1, GE2 and GE3 which overlap the first to third active patterns ACT1, ACT2 and ACT3, respectively, and a signal line to transmit driving signal for the pixel, such as a gate line.

The second insulation layer 130 may be disposed on the first insulation layer 120 on which the gate pattern is disposed. The second insulation layer 130 may insulate first to third source electrodes SE1, SE2 and SE3 and first to third drain electrodes DE1, DE2 and DE3 from the first to third gate electrodes GE1, GE2 and GE3, respectively. The second insulation layer 130 may be uniformly formed on the first insulation layer 120 along a profile of the gate pattern. Here, the second insulation layer 130 may have a substantially small thickness, such that a stepped portion may be formed at a portion of the second insulation layer 130 adjacent to the gate pattern. The second insulation layer 130 may be formed using a silicon compound. For example, the second insulation layer 130 may be formed using silicon oxide, silicon nitride, silicon oxynitride, silicon carbonitride, silicon oxycarbide, and etc.

A data pattern may be disposed on the second insulation layer 130. The data pattern may include the first to third source electrodes SE1, SE2 and SE3, the first to third drain electrodes DE1, DE2 and DE3, and a signal line to transmit driving signal for pixel such as a data line. The first to third electrodes SE1, SE2 and SE3 may be electrically connected to the first to third active patterns ACT1, ACT2 and ACT3 through contact holes formed through the first and second insulation layers 120 and 130, respectively. The first to third drain electrodes DE1, DE2 and DE3 may be electrically connected to the first to third active patterns ACT1, ACT2 and ACT3 through contact holes formed through the first and second insulation layers 120 and 130, respectively.

The first active pattern ACT1, the first gate electrode GE1, the first source electrode SE1 and the first drain electrode DE1 may be included in the first thin film transistor TFT1. The second active pattern ACT2, the second gate electrode GE2, the second source electrode SE2 and the second drain electrode DE2 may be included in the second thin film transistor TFT2. The third active pattern ACT3, the third gate electrode GE3, the third source electrode SE3 and the third drain electrode DE3 may be included in the third thin film transistor TFT3.

The planarization layer 140 may be disposed on the second insulation layer 130 on which the first to third thin film transistors TFT1, TFT2 and TFT3 are disposed. The planarization layer 140 may have a single-layered structure or a multi-layered structure including at least two insulation films. The planarization layer 140 may include photoresist, acryl-based resin, polyimide-based resin, polyamide-based resin, siloxane-based resin, etc. These may be used alone or in a combination thereof. Alternatively, the planarization layer 140 may include an inorganic material. For example, the planarization layer 140 may be formed using silicon oxide, metal, metal oxide and etc.

The first sub pixel electrode SPE1, the second sub pixel electrode SPE2, and the third sub pixel electrode SPE3 may be disposed on the planarization layer 140.

The first sub pixel electrode SPE1 may be connected to the first drain electrode DE1 thorough a contact hole formed through the planarization layer 140. The first sub pixel electrode SPE1 may be disposed corresponding to the first sub pixel SP11.

The second sub pixel electrode SPE2 may be connected to the second drain electrode DE2 thorough a contact hole formed through the planarization layer 140. The second sub pixel electrode SPE2 may be disposed corresponding to the second sub pixel SP12.

The third sub pixel electrode SPE3 may be connected to the third drain electrode DE3 thorough a contact hole formed through the planarization layer 140. The third sub pixel electrode SPE3 may be disposed corresponding to the third sub pixel SP13.

In some example embodiments, a contact, a plug or a pad may be formed in the contact hole, and then the first sub pixel electrode SPE1 may be formed on the contact, the plug or the pad. Here, the first sub pixel electrode SPE1 may be electrically connected to the first drain electrode DE1 through the contact, the plug or the pad. The second sub pixel electrode SPE2 and the third sub pixel electrode SPE3 may have a structure similar to that of the first sub pixel electrode SPE1.

The pixel defining layer PDL may be disposed on the planarization layer 140 on which the first to third sub pixel electrodes SPE1, SPE2 and SPE3 are disposed. The pixel defining layer PDL may define openings which expose the first to third sub pixel electrodes SPE1, SPE2 and SPE3, respectively. The pixel defining layer PDL may be a black pixel defining layer (black PDL). Thus, the pixel defining layer PDL may include opaque material which blocks light and has black color. For example, the pixel defining layer PDL may include carbon black, organic insulation material, and etc.

The first light emitting structure 151 may be positioned on the first sub pixel electrode SPE1 exposed by the opening of the pixel defining layer PDL. The first light emitting structure 151 may extend on a sidewall of an opening of the pixel defining layer PDL. The first light emitting structure 151 may include an organic light emitting layer (EL), a hole injection layer (HIL), a hole transport layer (HTL), an electron transport layer (ETL), an electron injection layer (EIL), etc. Depending on the embodiment, some or all of these layers may be part of the "common layer" that is shared by neighboring sub pixels. In example embodiments, the hole injection layer, the hole transport layer, the electron transport layer and the electron injection layer—and excluding the organic light emitting layer—may be commonly formed to comprise a common layer corresponding to the plurality of pixels. The first light emitting structure 151 may be formed using light emitting material which emits the first color light. In some example embodiments, the organic light emitting layer of the first light emitting structure 151 may include a plurality of stacked light emitting materials for generating a red color light, a green color light and a blue color light to thereby emit a white color light. These example embodiments may further include a color filter layer which overlaps the first light emitting structure 151 and converts the white color light to change the first color light. Here, the light emitting structures may be commonly formed corresponding to the plurality of pixels, and each of the pixels may be divided by the color filter layer.

The second light emitting structure 152 may be positioned on the second sub pixel electrode SPE2 exposed by the opening of the pixel defining layer PDL. The second light emitting structure 152 may be formed using light emitting material which emits the second color light. In some example embodiments, the organic light emitting layer of the second light emitting structure 152 may include a plurality of stacked light emitting materials for generating a red color light, a green color light and a blue color light to thereby emit a white color light. These example embodiments may further include a color filter layer which overlaps the second light emitting structure 152 and converts the white color light to change the second color light.

The third light emitting structure 153 may be positioned on the third sub pixel electrode SPE3 exposed by an opening between neighboring pixel defining layers PDLs. The third light emitting structure 153 may be formed using light emitting material that emits the third color light. In some example embodiments, the organic light emitting layer of the third light emitting structure 153 may include a plurality of stacked light emitting materials for generating a red color light, a green color light and a blue color light to thereby emit a white color light. These example embodiments may further include a color filter layer which overlaps the third light emitting structure 153 and converts the white color light to the third color light.

The opposite electrode CE may be disposed on the pixel defining layer PDL and the first to third light emitting structures 151, 152 and 153. The opposite electrode CE may include transmissive material when the organic light emitting display apparatus is a top emission type. For example, the opposite electrode CE may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in combination. In example embodiments, the opposite electrode CE may have a single layer structure or a multi layer structure, which may include a metal film, an alloy film, a metal nitride film, a conductive metal oxide film and/or a transparent conductive film.

The sealing substrate 200 pray be disposed on the opposite electrode CE. The sealing substrate 200 may include a glass substrate, a quartz substrate, a transparent resin substrate, etc. Examples of the transparent resin substrate for the sealing substrate 200 may include polyimide-based resin, acryl-based resin, polyacrylate-based resin, polycarbonate-based resin, polyether-based resin, sulfonic acid containing resin, polyethyleneterephthalate-based resin, etc.

In example embodiments, a predetermined space may be provided between the opposite electrode CE and the sealing substrate 200. This space may be filled with air or an inactive gas such as a nitrogen ($N_2$) gas. In some example embodiments, a protection layer (not illustrated) may be additionally disposed between the opposite electrode CE and the sealing substrate 200. Here, the protection layer may include a resin, for example, photoresist, acryl-based resin, polyimide-based resin, polyamide-based resin, siloxane-based resin, etc. These may be used or in a combination thereof.

The first mirror pattern MR1 may be disposed on a surface of the sealing substrate 200 which faces the opposite electrode CE. The first mirror pattern MR1 defines one opening OP corresponding to the first to third sub pixels SP11, SP12 and SP13 of the first pixel PX1, which is one pixel. The first mirror pattern MR1 may include a material having high reflectivity such as metal to reflect external light. For example, the first mirror pattern MR1 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiments, the first mirror pattern MR1 may have multi layer structure having at least one transparent conductive metal oxide layer and metal layer. For example, the first mirror pattern MR1 may include ITO/Ag/ITO triple layers.

The opening OP of the first mirror pattern MR1 may be formed to overlap the first to third sub pixels SP11, SP12 and SP13 of the first pixel PX1. In plan view, the first to third sub pixels SP11, SP12 and SP13 are disposed in the opening OP, so that the first mirror pattern MR1 is disposed to not overlap the first to third sub pixels SP11, SP12 and SP13.

Thus, one opening OP of the first mirror pattern MR1 is formed for each pixel. One opening OP corresponds to a plurality of sub pixels (first to third sub pixels in this embodiment) in one pixel.

The second mirror layer MR2 may be disposed on the second base substrate 210 on which the first mirror pattern MR1 is disposed. The second minor layer MR2 may be formed on the entirety of the sealing substrate 200. The second mirror layer MR2 may include a material which is the same as that of the first mirror pattern MR1 or different from that of the first mirror pattern MR1. Thickness of the second mirror layer MR2 may be smaller than thickness of the first mirror pattern MR1. The second mirror layer MR2 may partially reflect and partially transmit external light in the first to third sub pixels SP11, SP12 and SP13. The second mirror layer MR2 may include a material having high reflectivity, such as metal, to reflect external light. For example, the second mirror layer MR2 may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiments, the second mirror layer MR2 may have multi layer structure having at least one transparent conductive metal oxide layer and metal layer. For example, the second mirror layer MR2 may include ITO/Ag/ITO triple layers.

The second mirror layer MR2 may cover a boundary of the first mirror pattern MR1, so that blurring due to at scattered reflection at the boundary of the first mirror pattern MR1 may be decreased. Although the organic light emitting display apparatus includes the second mirror layer MR2, the second mirror layer MR2 may be omitted if necessary.

Figure 3:
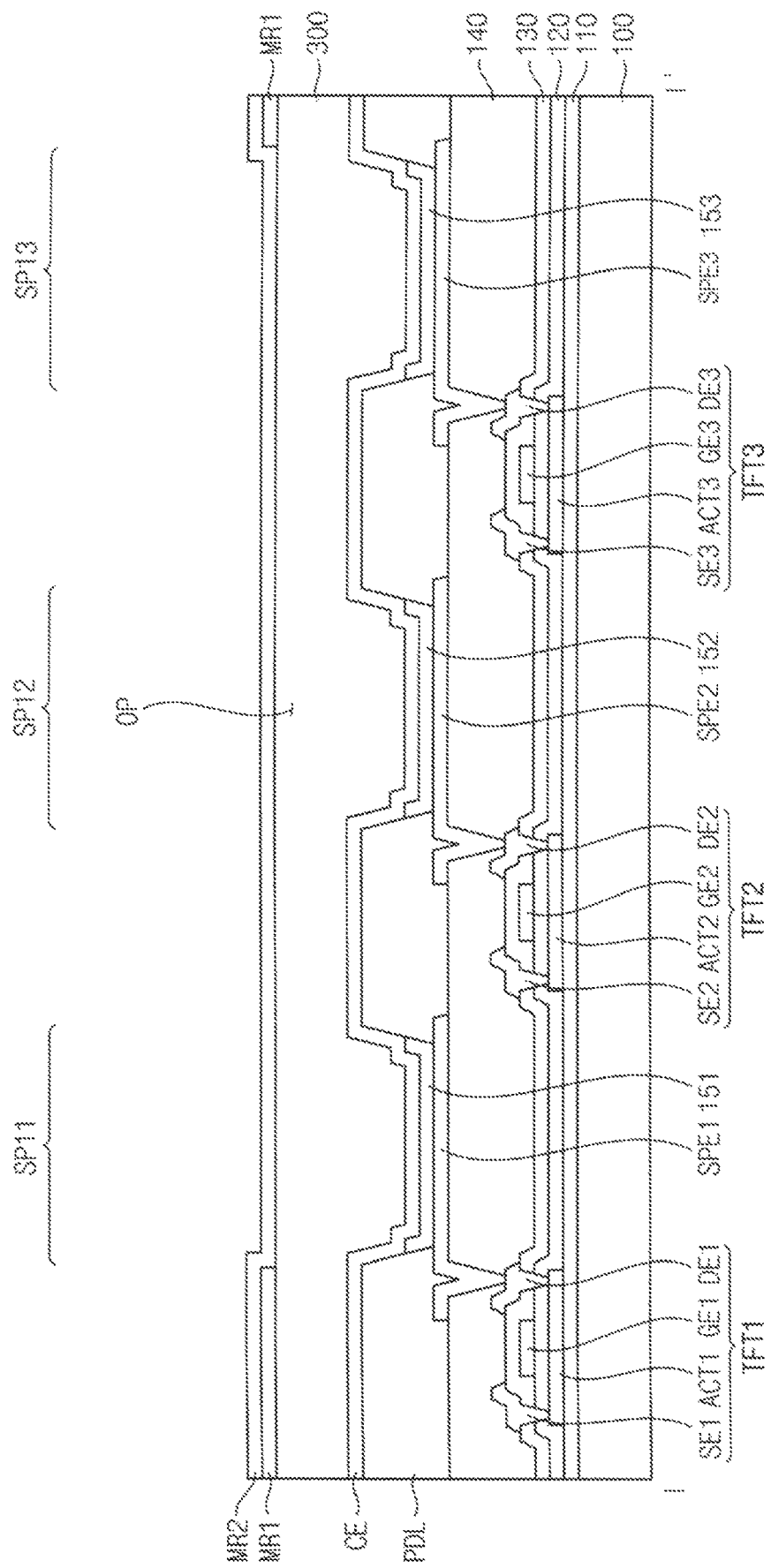
FIG. 3 is a cross-sectional view illustrating an organic light emitting display apparatus according to an exemplary embodiment of the inventive concept.

FIG. 3 is a cross-sectional view illustrating an organic light emitting display apparatus according to an exemplary embodiment of the inventive concept.

Referring to FIG. 3, the organic light emitting display apparatus of the present example embodiment may be substantially the same as the organic light emitting display apparatus of FIGS. 1 and 2, except for a thin film encapsulation layer 300. Thus, any further detailed descriptions concerning the same elements will be omitted.

The organic light emitting display apparatus may include a base substrate 100, a buffer layer 110, a first insulation layer 120, a second insulation layer 130, a planarization layer 140, a first thin film transistor TFT1, a second thin film transistor TFT2, a third thin film transistor TFT3, a first sub pixel electrode SPE1, a second sub pixel electrode SPE2, third sub pixel electrode SPE3, a pixel defining layer PDL, a first light emitting structure 151, a second light emitting structure 152, a third light emitting structure 153, an opposite electrode CE, the thin film encapsulation layer 300, a first mirror pattern MR1 and a second mirror layer MR2.

The thin film encapsulation layer 300 is disposed on the pixel defining layer PDL and the opposite electrode CE. The thin film encapsulation layer 300 may cover the entire base substrate 100. In some example embodiments, the thin film encapsulation layer 300 may cover only a portion of the base substrate 100

The thin film encapsulation layer 300 may protect the opposite electrode CE and the first to third light emitting structures 151, 152 and 153, from ambient air and moisture. The thin film encapsulation layer 300 may include an inorganic film such as silicon oxide or silicon nitride film and an organic film such as epoxy or polyimide film which are alternately and repeatedly formed. However, example embodiments of thin film encapsulation layer 300 may be not limited thereto, and any structure of transparent thin film for sealing may be applied. In addition, stacking order of the inorganic film and the organic film may be changed if necessary.

The first mirror pattern MR1 may be disposed on the thin film encapsulation layer 300. The first mirror pattern MR1 defines one opening OP corresponding to the first to third sub pixels SP11, SP12 and SP13 of the first pixel PX1, which is one pixel. The first mirror pattern MR1 may include a material having high reflectivity such as metal to reflect external light.

The second mirror layer MR2 may be disposed on the thin film encapsulation layer 300 on which the first mirror pattern MR1 is disposed. The second mirror layer MR2 may be formed corresponding to the entirety of the base substrate 100. The second mirror layer MR2 may include a material which is the same as that of the first mirror pattern MR1 or different from that of the first mirror pattern MR1. Thickness of the second mirror layer MR2 may be smaller than thickness of the first mirror pattern MR1. The second mirror layer MR2 may partially reflect and partially transmit external light in the first to third sub pixels SP11, SP12 and SP13. The second mirror layer MR2 may include metal.

Although this embodiment of the inventive concept includes the second mirror layer MR2, the second mirror layer MR2 may be omitted if necessary.

In addition, although the first mirror pattern MR1 and the second mirror layer MR2 are disposed on the thin film encapsulation layer 300 in the present example embodiment, the first mirror pattern MR1 and the second mirror layer MR2 may be formed under the thin film encapsulation layer 300. Thus, the first mirror pattern MR1 and the second mirror layer MR2 may be formed between the thin film encapsulation layer 300 and the first to third light emitting structures 151, 152 and 153. In addition, the first mirror pattern MR1 and the second mirror layer MR2 may be formed inside of the thin film encapsulation layer 300. Thus, the first mirror pattern MR1 and the second mirror layer MR2 may be formed between the organic and inorganic films.

Figure 4:
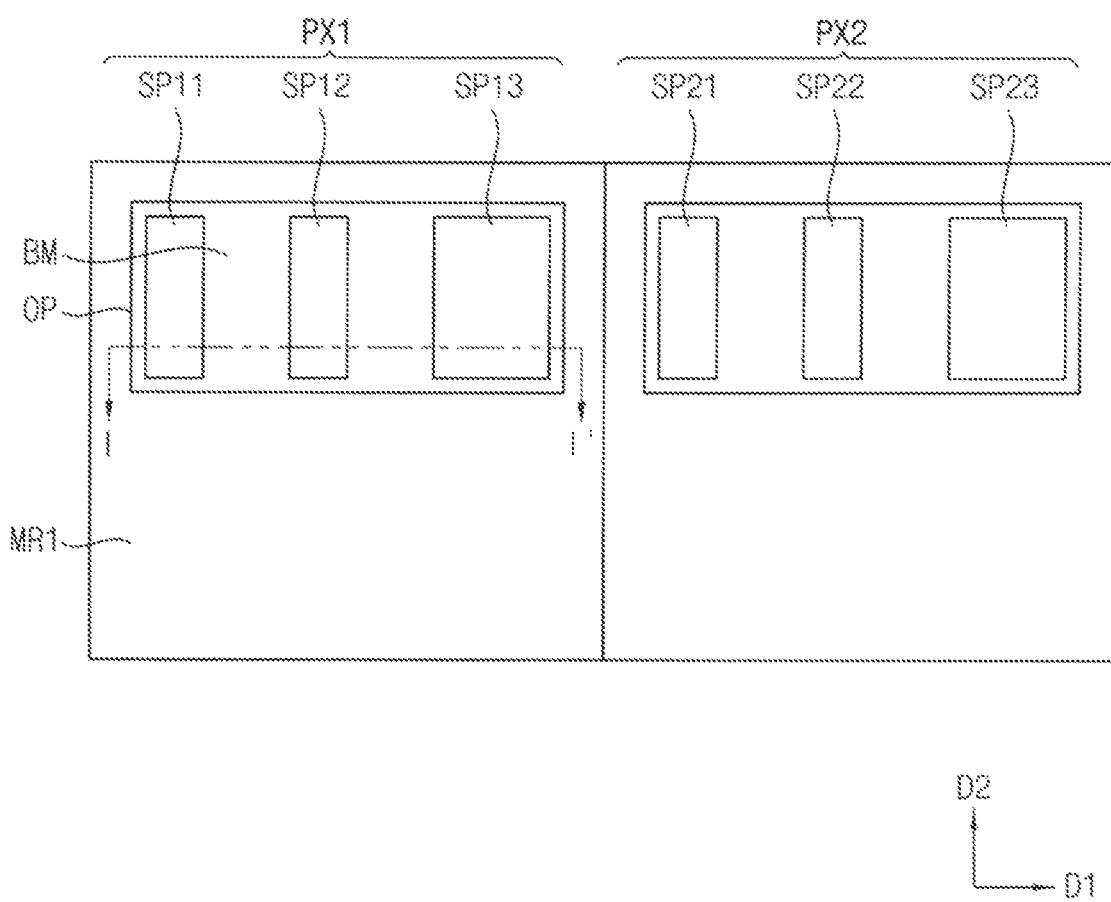
FIG. 4 is a plan view illustrating a pixel of an organic light emitting display apparatus according to an exemplary embodiment of the inventive concept.
Figure 5:
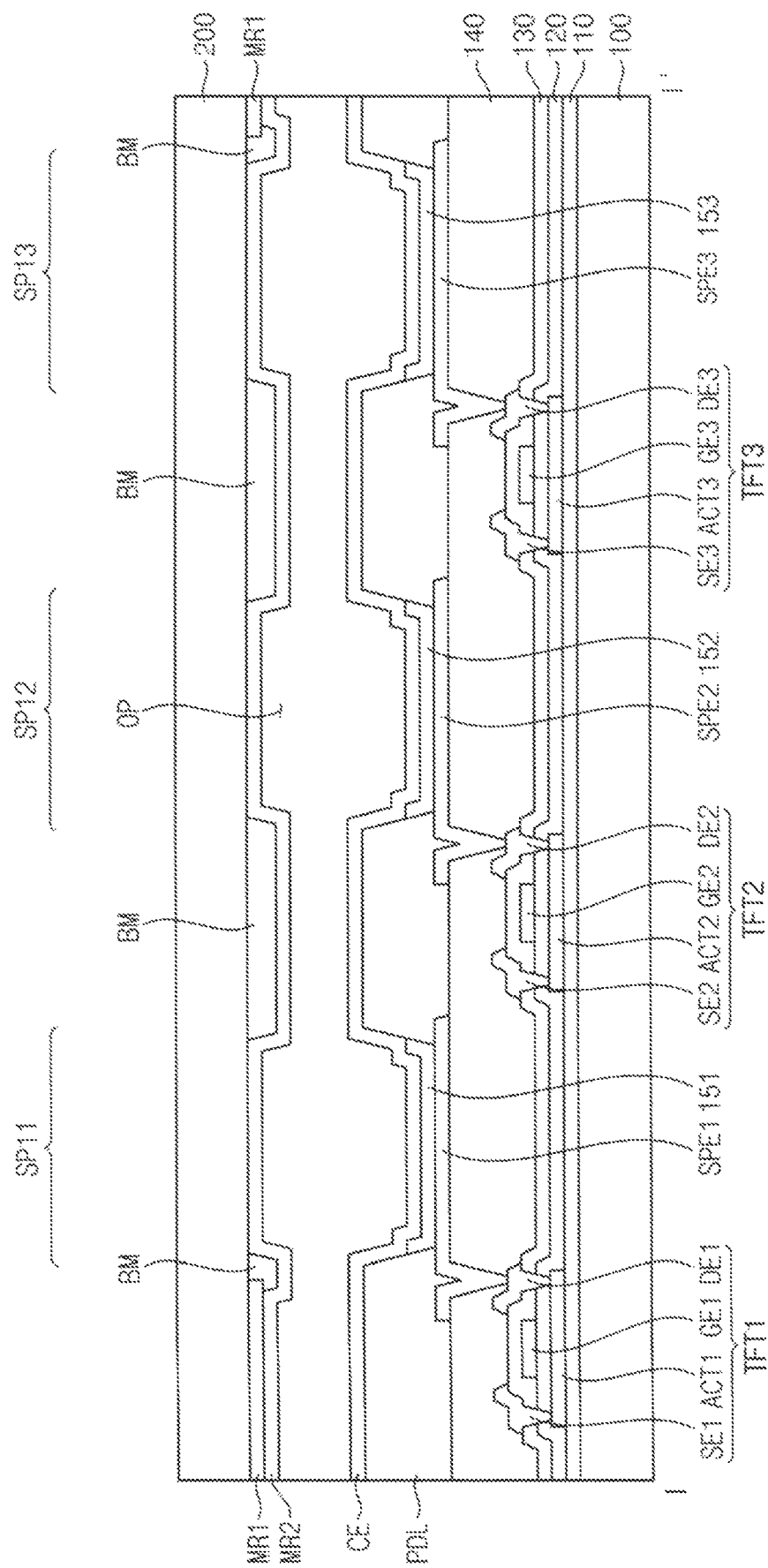
FIG. 5 is a cross-sectional view taken along a line I-I' of FIG. 4.

FIG. 4 is a plan view illustrating a pixel of an organic light emitting display apparatus according to an exemplary embodiment of the inventive concept. FIG. 5 is a cross-sectional view taken along a line I-I' of FIG. 4.

Referring to FIGS. 4 and 5, the organic light emitting display apparatus of the present example embodiment may be substantially the same as the organic light emitting display apparatus of FIGS. 1 and 2, except for a black matrix BM. Thus, any further detailed descriptions concerning the same elements will be omitted.

The organic light emitting display apparatus may include a base substrate 100, a buffer layer 110, a first insulation layer 120, a second insulation layer 130, a planarization layer 140, a first thin film transistor TFT1, a second thin film transistor TFT2, a third thin film transistor TFT3, a first sub pixel electrode SPE1, a second sub pixel electrode SPE2, a third sub pixel electrode SPE3, a pixel defining layer PDL, a first light emitting structure 151, a second light emitting structure 152, a third light emitting structure 153, an opposite electrode CE, a sealing substrate 200, the black matrix BM, a first mirror pattern MR1 and a second mirror layer MR2.

The black matrix BM may be disposed on the sealing substrate 200. The black matrix BM may be disposed to overlap the pixel defining layer PDL in an opening OP of the first mirror pattern MR1. The black matrix BM may include a light blocking material. The black matrix BM may define openings corresponding to the first to third light emitting structures 151, 152 and 153. Thus, the black matrix BM is disposed in the opening OP of the first mirror pattern MR1 where the first to third light emitting structures 151, 152 and 153 are not formed, so that degradation of display quality due to reflection, diffraction, and scattering of light near light emitting areas may be reduced.

The first mirror pattern MR1 may be disposed on the sealing substrate 200 on which the black matrix BM is disposed. The second mirror layer MR2 may be disposed on the sealing substrate 200 on which the black matrix BM and the first mirror pattern MR1 are disposed.

Although the black matrix BM is formed on the sealing substrate 200 on which the first mirror pattern MR1 is formed in the present embodiment, the black matrix BM may be formed on the sealing substrate 200 before the first mirror pattern is formed. Although the present example embodiment includes the second mirror layer MR2, it may be omitted if necessary.

Figure 6:
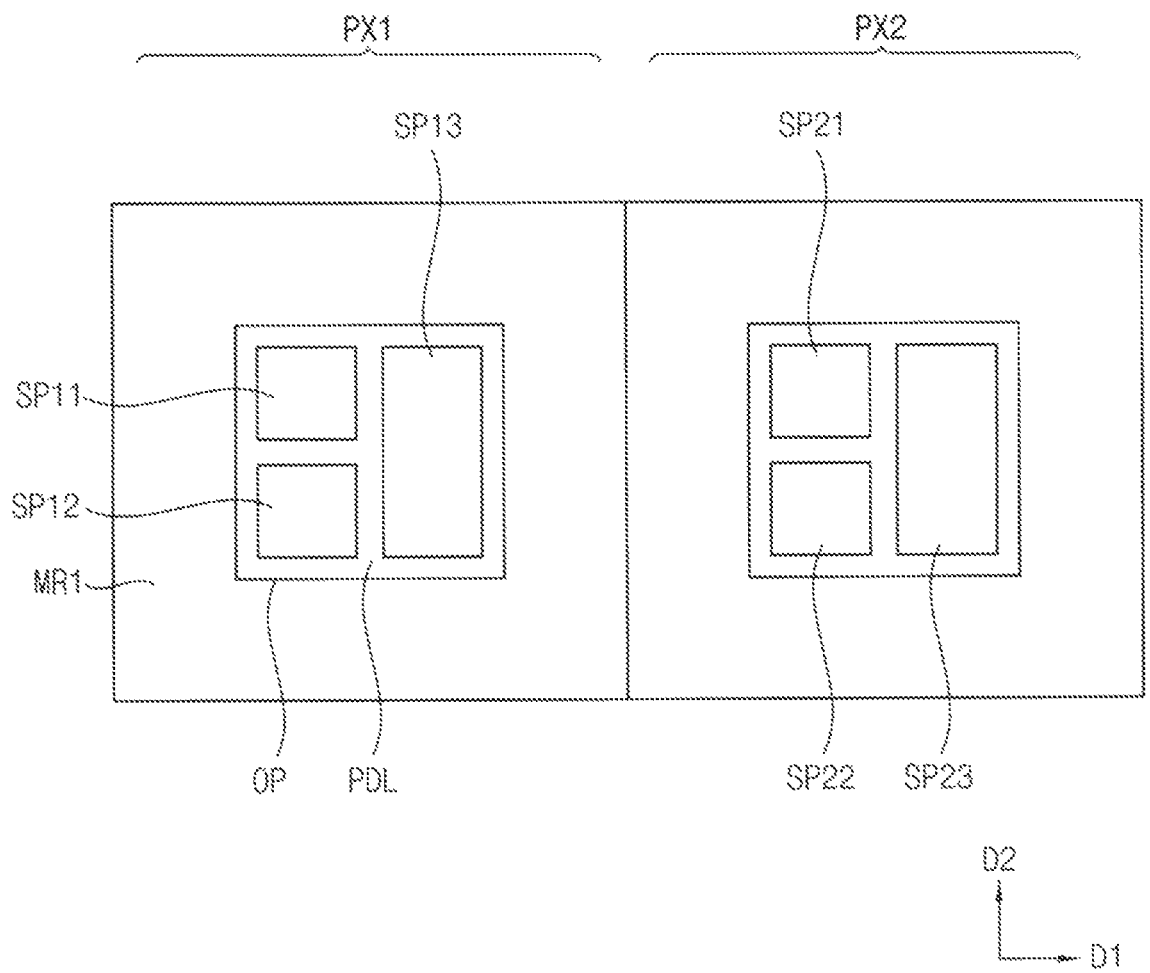
FIG. 6 is a plan view illustrating a pixel of an organic light emitting display apparatus according to an exemplary embodiment of the inventive concept.

FIG. 6 is a plan view illustrating a pixel of an organic light emitting display apparatus according to an exemplary embodiment of the inventive concept.

Referring to FIG. 6, the organic light emitting display apparatus of the present example embodiment may be substantially the same as the organic light emitting display apparatus of FIGS. 1 and 2, except for the shapes of first to third sub pixels and a shape of an opening of a first mirror pattern. Thus, any further detailed descriptions concerning the same elements will be omitted.

The organic light emitting display apparatus include the first pixel PX1 and the second pixel PX2. The first pixel PX1 may include a first sub pixel SP11, a second sub pixel SP12, and a third sub pixel SP13. The second pixel PX2 may include a first sub pixel SP21, a second sub pixel SP22, and a third sub pixel SP23.

The first pixel PX1 and the second pixel PX2 may be disposed adjacent to each other in a first direction D1.

The first sub pixel SP11 of the first pixel PX1 is disposed adjacent to the second sub pixel SP12 in a second direction D2. The third sub pixel SP13 is disposed adjacent to the first sub pixel SP11 and the second sub pixel SP12 in the first direction D1. The first sub pixel SP11 and the second sub pixel SP12 may each be a little less than half the length of the third sub pixel SP13 in the second direction, such that the first to third sub pixels SP11, SP12 and SP13 may be arranged to form a square outline as shown in FIG. 6.

The second pixel PX2 may be substantially the same as the first pixel PX1.

A first mirror pattern MR1 is formed where the first to third sub pixels SP11 to SP23 of the first and second pixels PX1 and PX2 are not disposed.

The first mirror pattern MR1 is formed corresponding to all of the plurality of pixels, and defines one opening OP for each of the pixel.

A pixel defining layer PDL may be formed to define the first to third sub pixels SP11 to SP23. The pixel defining layer PDL may be a black pixel defining layer (black PDL).

Figure 7:
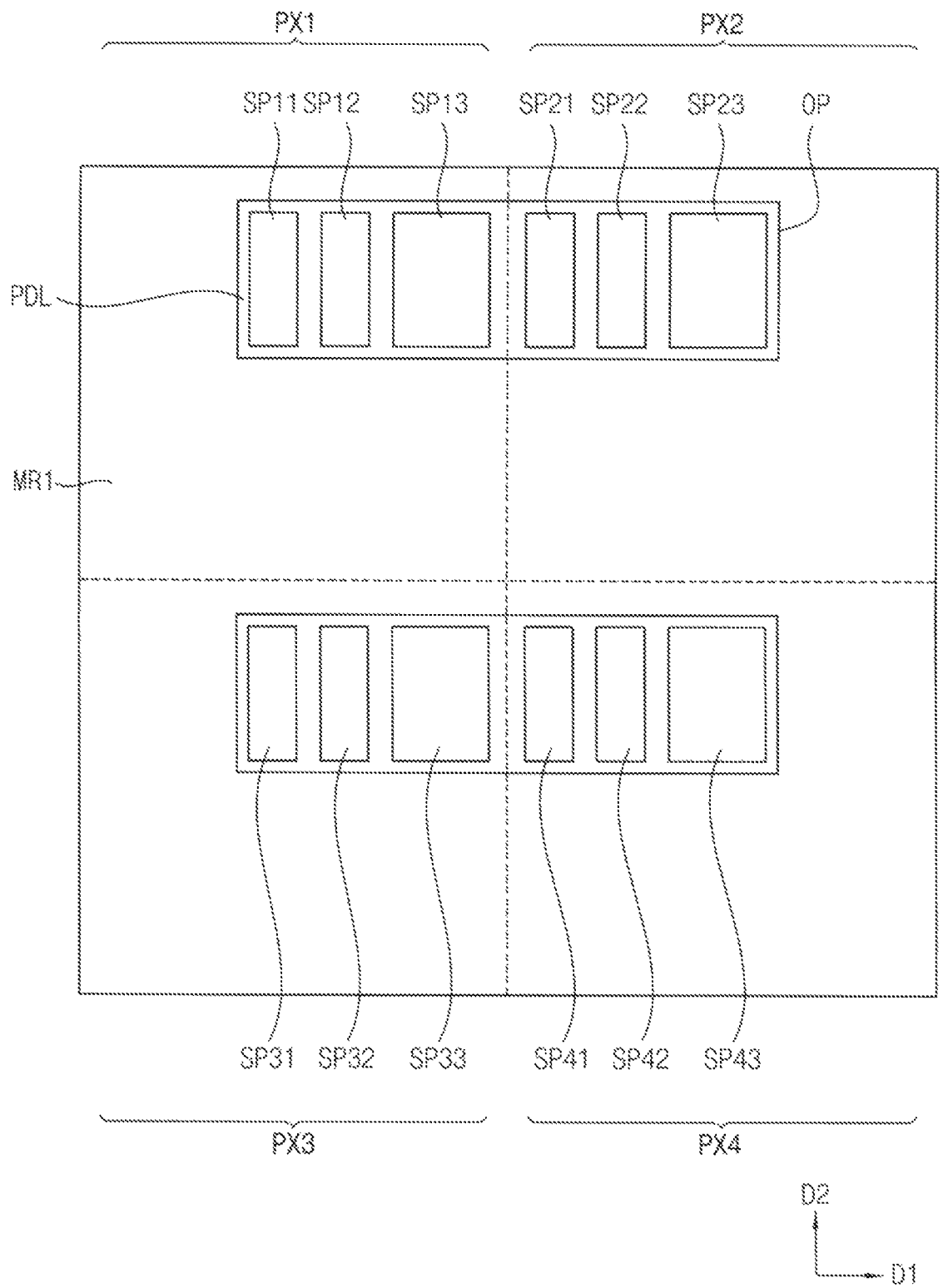
FIG. 7 is a plan view illustrating a pixel of an organic light emitting display apparatus according to an exemplary embodiment of the inventive concept.

FIG. 7 is a plan view illustrating a pixel of an organic light emitting display apparatus according to an exemplary embodiment of the inventive concept, Referring to FIG. 7, the organic light emitting display apparatus of the present example embodiment may be substantially the same as the organic light emitting display apparatus of FIGS. 1 and 2, except for a shape of an opening of a first mirror pattern. Thus, any further detailed descriptions concerning the same elements will be omitted.

The present example embodiment includes first to fourth pixels PX1 to PX4 arranged in a square configuration. The first pixel PX1 may include a set of first-pixel sub pixels (first sub pixel SP11, a second sub pixel SP12 and a third sub pixel SP13). The second pixel PX2 may include a set of second-pixel sub pixels (first sub pixel SP21, a second sub pixel SP22 and a third sub pixel SP23). The third pixel PX3 may include a set of third-pixel sub pixels (a first sub pixel SP31, a second sub pixel SP32 and a third sub pixel SP33). The fourth pixel PX4 may include a set of fourth-pixel sub pixels (a first sub pixel SP41, a second sub pixel SP42 and a third sub pixel SP43). Although the number of sub pixels in each pixel is shown as three in the example embodiments, this is not a limitation of the inventive concept.

The first pixel PX1 and the second pixel PX2 may be disposed adjacent to each other in a first direction D1. The third pixel PX3 may be disposed adjacent to the first pixel PX1 in a second direction D2. The fourth pixel PX4 may be disposed adjacent to the third pixel PX3 in the first direction D1, and disposed adjacent to the second pixel PX2 in the second direction D2.

A first mirror pattern MR1 is formed where the first to third sub pixels SP11 to SP43 of the first and fourth pixels PX1 to PX4 are not disposed.

The first mirror pattern MR1 is formed corresponding to all of the plurality of pixels, and defines one opening OP for each of two pixels adjacent to each other in the first direction D1.

Here, the first to third sub pixels SP11, SP12 and SP13 of the first pixel PX1 are not centered in the first pixel PX1 in the first direction D1. Rather, the positions of the first, second and third sub pixels SP11, SP12 and SP13 are shifted toward the second pixel PX2 so that they are disposed close to the boundary between the first pixel PX1 and the second pixel PX2. The positions of the first to third sub pixels SP21, SP22 and SP23 of the second pixel PX2 are also shifted toward the first pixel PX1 such that they are disposed close to the boundary between the first pixel PX1 and the second pixel PX2. One opening may be formed to continuously extend across the inter-pixel border and encompass the sub pixels of the first and second pixels PX1, PX2. This way, size of the opening OP is reduced as compared to the case where the sub-pixels are centered within each pixel. In addition, aperture ratio may be controlled by adjusting a size of the opening OP of the first mirror pattern MR1 by changing distance between the boundary and the sub pixels.

Figure 8:
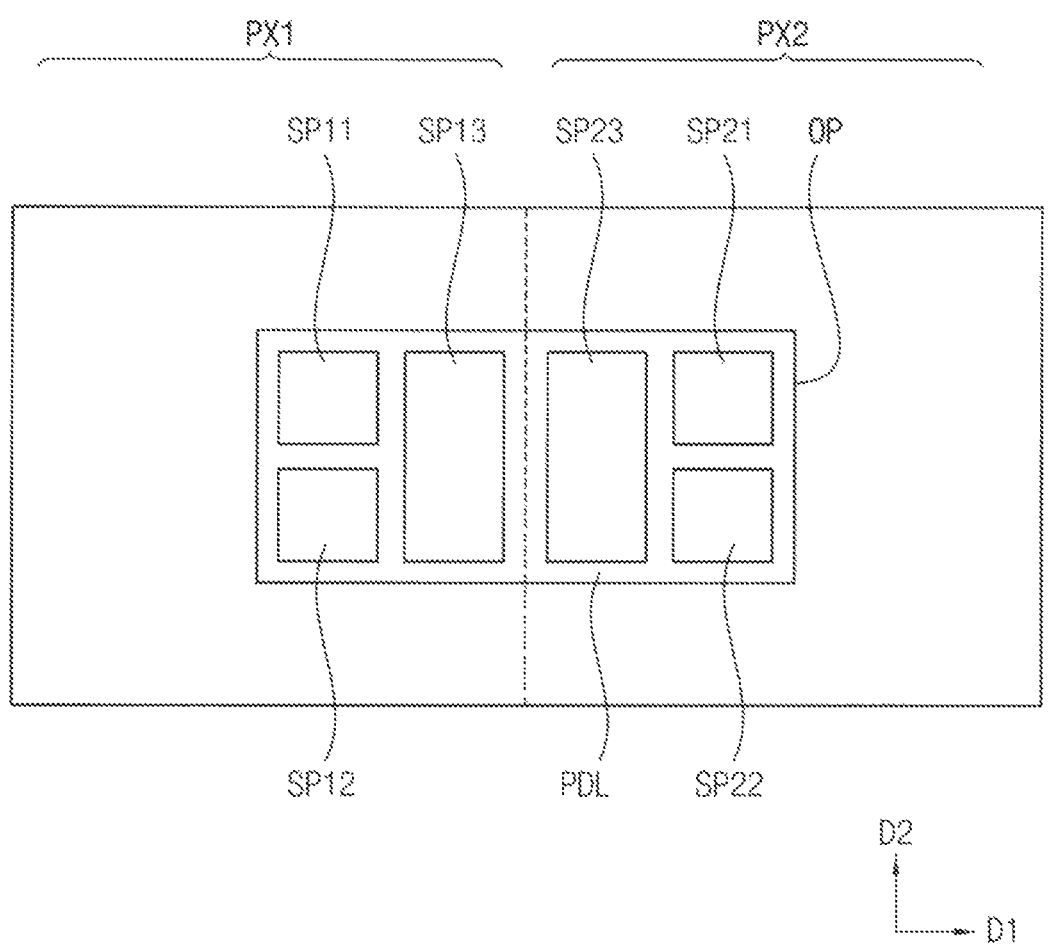
FIG. 8 is a plan view illustrating a pixel of an organic light emitting display apparatus according to an exemplary embodiment of the inventive concept.

FIG. 8 is a plan view illustrating a pixel of an organic light emitting display apparatus according to an exemplary embodiment of the inventive concept.

Referring to FIG. 8, the organic light emitting display apparatus of the present example embodiment may be substantially the same as the organic light emitting display apparatus of FIG. 6, except for a shape of an opening of a first mirror pattern. Thus, any further detailed descriptions concerning the same elements will be omitted.

A first sub pixel SP11 of a first pixel PX1 is disposed adjacent to a second sub pixel SP12 in a second direction D2. A third sub pixel SP13 may be disposed adjacent to the first sub pixel SP11 and the second sub pixel SP12 in a first direction D1. As the third sub pixel SP3 is approximately twice as long as the first and second sub pixels SP11, SP12 in the second direction D2, the first to third sub pixels SP11, SP12 and SP13 may be arranged to form a square outline.

A third sub pixel SP23 of a second pixel PX2 is disposed adjacent to a first sub pixel SP21 in the first direction D1. The first sub pixel SP21 and a second sub pixel SP22 is disposed adjacent to the second sub pixel SP22 in the first direction D1. The first sub pixel SP21 and the second sub pixel SP22 are disposed adjacent to each other in the second direction D2.

Thus, the first to third sub pixels SP11, SP12 and SP13 of the first pixel PX1 and the first to third sub pixels SP21, SP22 and SP23 of the second pixel PX2 may he symmetrically disposed with respect to the boundary of the first pixel PX1 and the second pixel PX2. A single opening OP that extends across the boundary between the first pixel PX1 and the second pixel PX2 may transmit light from sub pixels SP11, SP12, SP13, SP23, SP22, and SP21.

A first mirror pattern MR1 is formed where the first to third sub pixels SP11 to SP23 of the first and second pixels PX1 and PX2 are not disposed.

The first mirror pattern MR1 is formed corresponding to all of the plurality of pixels, and defines one opening OP for each of two pixels adjacent to each other in the first direction D1.

Here, the first to third pixels SP11, SP12 and SP13 of the first pixel PX1 are disposed close to boundary of the first pixel PX1 and the second pixel PX2. The first to third pixels SP21, SP22 and SP23 of the second pixel PX2 are also disposed close to the boundary of the first pixel PX1 and the second pixel PX2. Accordingly, size of the opening OP may be minimized. In addition, aperture ratio may be controlled by adjusting a size of the opening OP of the first mirror pattern MR1 by changing distance between the boundary and the sub pixels.

Figure 9:
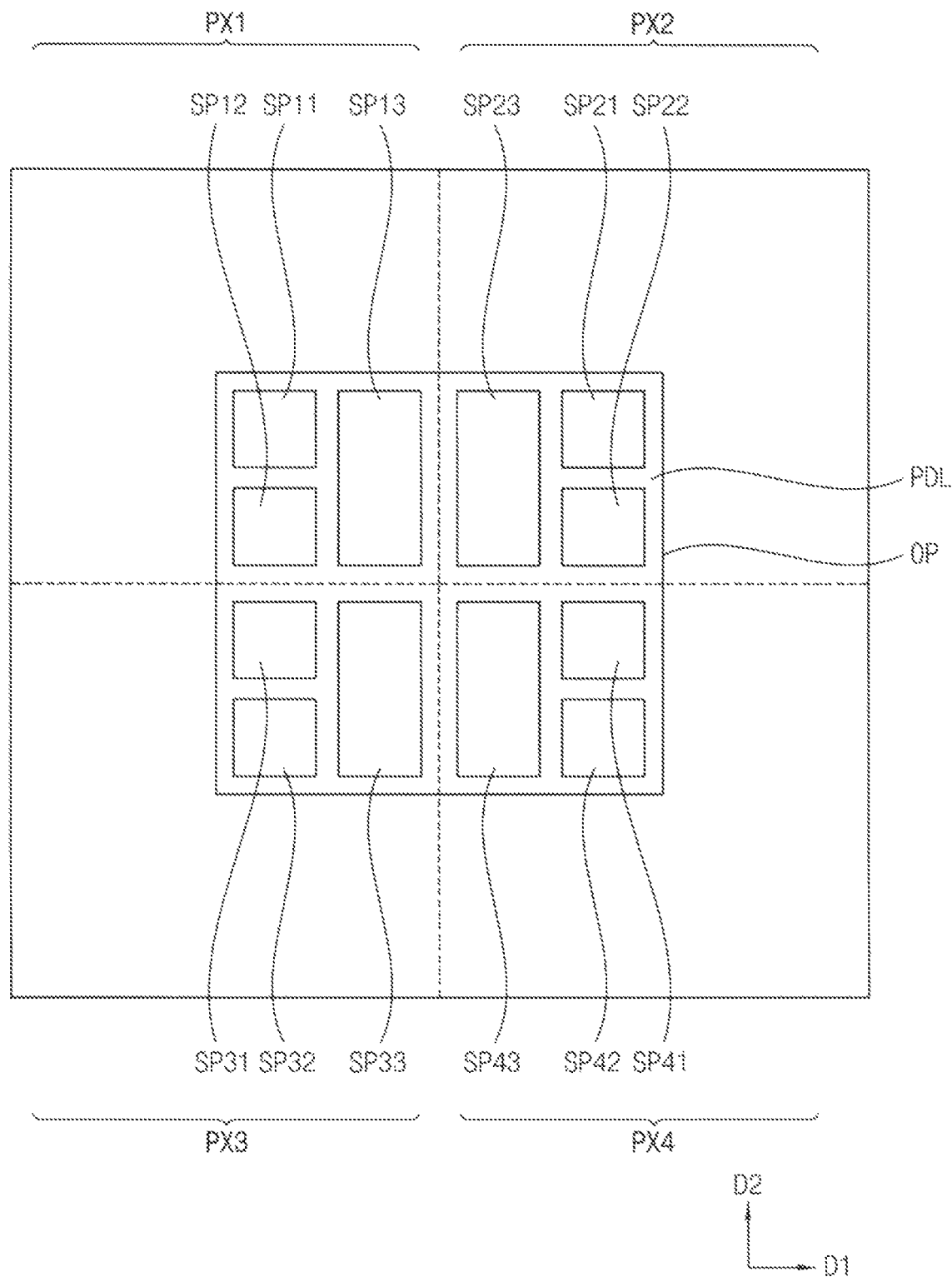
FIG. 9 is a plan view illustrating a pixel of an organic light emitting display apparatus according to an exemplary embodiment of the inventive concept.

FIG. 9 is a plan view illustrating a pixel of an organic light emitting display apparatus according to an exemplary embodiment of the inventive concept.

Referring to FIG. 9, the organic light emitting display apparatus of the present example embodiment may be substantially the same as the organic light emitting display apparatus of FIG. 8, except for a shape of first to third sub pixels and a shape of an opening of a first mirror pattern. Thus, any further detailed descriptions concerning the same elements will be omitted.

The present example embodiment includes first to fourth pixels PX1 to PX4. The first pixel PX1 may include a first sub pixel SP11, a second sub pixel SP12 and a third sub pixel SP13. The second pixel PX2 may include a first sub pixel SP21, a second sub pixel SP22 and a third sub pixel SP23. The third pixel PX3 may include a first sub pixel SP31, a second sub pixel SP32 and a third sub pixel SP33. The fourth pixel PX4 may include a first sub pixel SP41, a second sub pixel SP42 and a third sub pixel SP43.

The first pixel PX1 and the second pixel PX2 may be disposed adjacent to each other in a first direction D1. The third pixel PX3 may be disposed adjacent to the first pixel PX1 in a second direction D2. The fourth pixel PX4 may be disposed adjacent to the third pixel PX3 in the first direction D1, and disposed adjacent to the second pixel PX2 in the second direction D2.

The first to third sub pixels SP11, SP12 and SP13 of the first pixel PX1 and the first to third sub pixels SP21, SP22 and SP23 of the second pixel PX2 may be symmetrically disposed with respect to the boundary between the first pixel PX1 and second pixel PX2.

The first to third sub pixels SP31, SP32 and SP33 of the third pixel PX3 and the first to third sub pixels SP41, SP42 and SP43 of the fourth pixel PX4 may be symmetrically disposed with respect to the boundary between the third pixel PX3 and fourth pixel PX4.

A first pattern MR1 is formed where the first to third sub pixels SP11 to SP43 of the first to fourth pixels PX1 to PX4 are not disposed.

The first mirror pattern MR1 is formed corresponding to all of the plurality of pixels, and defines one opening OP for each of four pixels adjacent to each other. The sub pixels of each of the pixels PX1, PX2, PX3, and PX4 are shifted in position to be close to where the four pixels meet. Thus, the first to third sub pixels SP11 to SP43 of the first to fourth pixels PX1 to PX4 are disposed in one opening OP that extends into the four pixels.

According to the present inventive concept, an organic light emitting display apparatus includes a pixel defining layer having black color, and a first mirror pattern having an opening. A plurality of sub pixels (for example, first to third sub pixels) are disposed in the opening, so that distance between openings disposed adjacent to each other is larger, as compared to a case where each of the openings are formed corresponding to each of the sub pixels. Accordingly, diffraction due to the opening of the first mirror pattern may be reduced. In addition, each of the opening has a relatively large size, so that the base substrate and the sealing substrate are properly aligned during assembly.

In addition, the first mirror pattern is disposed to not overlap the first to third sub pixels which form the light emitting areas. Accordingly, aperture ratio is improved compared to a structure which has a mirror pattern covering the light emitting area. Thus, display quality may be improved.

In addition, the pixel defining layer has black color, so that degradation of display quality due to reflection, diffraction and scattering of light may be reduced although the pixel defining layer is formed in the opening.

In addition, the organic light emitting display apparatus may obtain desired reflectance by controlling the size of the opening of the first mirror pattern while the sizes of the first to third sub pixels remain constant.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. An organic light emitting display apparatus comprising a plurality of pixels, each of the pixels comprising:
   a first mirror pattern having an opening and completely surrounding the each of the pixels, the first mirror pattern reflecting external light;
   a black matrix overlapping edges of the first mirror pattern and not overlapping a center portion of the first mirror pattern disposed between adjacent pixels in a plan view;
   a second mirror pattern overlapping the black matrix;
   a first sub pixel including a first light emitting structure positioned to emit first color light through the opening;

a second sub pixel including a second light emitting structure positioned to emit second color light through the opening;

a third sub pixel including a third light emitting structure positioned to emit third color light through the opening; and a pixel defining layer which is opaque and disposed between adjacent light emitting structures in the opening, wherein the first light emitting structure has a first organic light emitting layer, the second light emitting structure has a second organic light emitting layer, and the third light emitting structure has a third organic light emitting layer, and wherein the black matrix overlaps opposing edges of the first mirror pattern.

2. The organic light emitting display apparatus of claim 1, wherein the pixel defining layer comprises carbon black and organic insulation material.

3. The organic light emitting display apparatus of claim 1, wherein the first sub pixel, the second sub pixel and the third sub pixel are arranged in a first direction.

4. The organic light emitting display apparatus of claim 1, wherein the first sub pixel and the second sub pixel are disposed adjacent to each other in a second direction which crosses a first direction, and the third sub pixel is disposed adjacent to the first and second sub pixels in the first direction.

5. The organic light emitting display apparatus of claim 1, wherein the plurality of pixels comprises a first pixel and a second pixel, wherein the first pixel comprises a set of first-pixel sub pixels and the second pixel comprises a set of second-pixel sub pixels, and wherein the opening continuously extends from the first pixel to the second pixel, so that the first-pixel sub pixels and the second-pixel sub pixels are disposed in the opening.

6. The organic light emitting display apparatus of claim 5, wherein the first-pixel sub pixels and the second-pixel sub pixels are symmetrically arranged with respect to a boundary between the first pixel and the second pixel.

7. The organic light emitting display apparatus of claim 5, further comprising a third pixel that has a set of third-pixel sub pixels and a fourth pixel that has fourth-pixel sub pixels, wherein the each of the first, second, third, and fourth pixels shares a border with two other pixels of the first, second, third, and fourth pixels, the opening extends continuously across the borders between the first pixel, the second pixel, the third pixel, and the fourth pixel so that the first-pixel sub pixels, the second-pixel sub pixels, the third-pixel sub pixels, and the fourth-pixel sub pixels are disposed in the opening.

8. The organic light emitting display apparatus of claim 1, further comprising a sealing substrate, wherein the first minor pattern is disposed on the sealing substrate.

9. The organic light emitting display apparatus of claim 8, wherein the pixel defining layer separates the first light emitting structure, the second light emitting structure, and the third light emitting structure from one another.

10. The organic light emitting display apparatus of claim 1, wherein the first sub pixel comprises a first sub pixel electrode and the first light emitting structure is disposed on the first sub pixel electrode, the second sub pixel comprises a second sub pixel electrode and the second light emitting structure is disposed on the second sub pixel electrode, and the third sub pixel comprises a third sub pixel electrode and the third light emitting structure is disposed on the third sub pixel electrode, and wherein the first, second, and third sub pixel electrodes are connected to first, second, and third thin film transistors, respectively, and do not overlap the first, second, and third thin film transistors.

11. The organic light emitting display apparatus of claim 1, further comprising a thin film encapsulation layer which is disposed on the first light emitting structure, the second light emitting structure, and the third light emitting structure and comprises at least one inorganic film and at least one organic film, the at least one of the inorganic film and the at least one of the organic film being alternately stacked.

12. The organic light emitting display apparatus of claim 11, wherein the first minor pattern is disposed on the thin film encapsulation layer.

13. The organic light emitting display apparatus of claim 11, wherein the first minor pattern is disposed between the inorganic film and the organic film of the thin film encapsulation layer.

14. The organic light emitting display apparatus of claim 10, wherein the first sub pixel electrode overlaps with the first organic light emitting layer, the second sub pixel electrode overlaps with the second organic light emitting layer and a third sub pixel electrode overlaps with the third organic light emitting layer, and wherein the first light emitting structure, the second light emitting structure, and the third light emitting structure further comprises an opposite electrode covering the first sub pixel, the second sub pixel, and the third sub pixel.

15. An organic light emitting display apparatus, comprising:

a base substrate;

a plurality of pixels disposed on the base substrate, each of the plurality of pixels comprising a first sub pixel and a second sub pixel, the first sub pixel including a first sub pixel electrode disposed on the base substrate and connected to a first thin film transistor, and the second sub pixel including a second sub pixel electrode disposed on the base substrate, connected to a second thin film transistor and spaced apart from the first sub pixel electrode;

a pixel defining layer which is opaque and disposed between the first sub pixel electrode and the second sub pixel electrode;

a first mirror pattern overlapping the pixel defining layer, having an opening and completely surrounding the first sub pixel electrode and the second sub pixel electrode, the first mirror pattern reflecting external light;

a black matrix overlapping edges of the first mirror pattern and not overlapping a center portion of the first mirror pattern disposed between adjacent pixels in a plan view; and a second mirror pattern overlapping the black matrix, wherein the black matrix overlaps opposing edges of the first mirror pattern.

16. The organic light emitting display apparatus of claim 15, wherein the plurality of pixels are arranged in a matrix form such that at least two pixels of the plurality of pixels are adjacent to each other to form a pair of adjacent pixels, the each of the plurality of pixels further comprising a third sub pixel, wherein one opening of the first mirror pattern is formed for each of two pixels which are disposed adjacent to each other, and wherein portions of the first sub pixel and the second sub pixel of each pair of adjacent pixels are disposed in the opening.

17. The organic light emitting display apparatus of claim 15, the each of the plurality of pixels further comprising a third sub pixel which includes a third pixel electrode that is disposed adjacent to the first sub pixel electrode in a first direction, wherein the first sub pixel electrode is disposed adjacent to the second sub pixel electrode in a second direction.

18. The organic light emitting display apparatus of claim 15, wherein the plurality of pixels are arranged in a matrix form such that at least two pixels of the plurality of pixels are adjacent to each other to form a pair of adjacent pixels, the each of the plurality of pixels further comprising a third sub pixel, wherein an arrangement of the first sub pixel, the second sub pixel, and the third sub pixel of one pixel of the pair of adjacent pixels is symmetric to an arrangement of the first sub pixel, the second sub pixel, and the third sub pixel of another pixel of the pair of adjacent pixels, with respect to a boundary between the adjacent pixels.

\* \* \* \* \*